US012490388B2

(12) United States Patent
Poot Rodriguez et al.

(10) Patent No.: US 12,490,388 B2
(45) Date of Patent: Dec. 2, 2025

(54) OVERMOLDED PRINTED CIRCUIT BOARD AND CONNECTOR WITH INTEGRATED STAND-UP MOUNTING AND GROUND CONNECTION

(71) Applicant: Vitesco Technologies USA, LLC, Auburn Hills, MI (US)

(72) Inventors: David Poot Rodriguez, Tlaquepaque (MX); James D. Baer, Gurnee, IL (US); Edward Hribar, Palos Hills, IL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 353 days.

(21) Appl. No.: 18/050,430

(22) Filed: Oct. 27, 2022

(65) Prior Publication Data

US 2023/0397346 A1 Dec. 7, 2023

Related U.S. Application Data

(60) Provisional application No. 63/349,579, filed on Jun. 6, 2022.

(51) Int. Cl.
*H05K 5/00* (2025.01)
*H01R 12/70* (2011.01)
(Continued)

(52) U.S. Cl.
CPC ....... *H05K 5/0034* (2013.01); *H01R 12/7011* (2013.01); *H01R 12/7076* (2013.01);
(Continued)

(58) Field of Classification Search
CPC .. H05K 5/0034; H05K 1/0215; H05K 5/0069; H05K 5/0204; H01R 12/7011;
(Continued)

(56) References Cited

U.S. PATENT DOCUMENTS

| | | | | |
|---|---|---|---|---|
| 4,932,888 | A | * | 6/1990 | Senor ................. H01R 13/6599 439/108 |
| 5,538,433 | A | * | 7/1996 | Arisaka ................ H01R 12/523 257/691 |

(Continued)

*Primary Examiner* — Timothy J Thompson
*Assistant Examiner* — Sidi M Maiga (57) ABSTRACT

A control unit which meets desired packaging requirements, eliminates the need for right-angle or L-shaped pins, and has a reduced footprint. The control unit includes a connector, a circuit board connected to the connector, and an encapsulation housing. The encapsulation housing surrounds at least a portion of the circuit board and at least a portion of the connector. The connector includes a base flange, a shroud integrally formed with the base flange, a plurality of pins extending through the base flange and partially extending into the circuit board. The connector also includes at least one grounding pin connected to the base flange which partially extends into the circuit board. A bushing extends through a mounting post formed as part of the base flange such that the bushing is in contact with the grounding pin, where the grounding pin and the bushing are part of a grounding connection.

18 Claims, 13 Drawing Sheets

(51) Int. Cl.
    *H05K 1/02*         (2006.01)
    *H05K 5/02*         (2006.01)
(52) U.S. Cl.
    CPC ......... *H05K 1/0215* (2013.01); *H05K 5/0069*
                         (2013.01); *H05K 5/0204* (2013.01)
(58) Field of Classification Search
    CPC .............. H01R 12/7076; H01R 12/716; H01R
                    13/6595; H01R 12/7064; H01R 13/514;
                    H01R 13/6586; H01R 13/518
    USPC ........................................................ 361/752
    See application file for complete search history.

(56) References Cited

U.S. PATENT DOCUMENTS

| | | | |
|---|---|---|---|
| 9,385,059 B2 | 7/2016 | Ossimitz | |
| 10,834,833 B1* | 11/2020 | Yoder | .................. H05K 5/0069 |
| 2004/0125582 A1* | 7/2004 | Asano | .............. H01L 23/49811 |
| | | | 257/E25.031 |
| 2009/0258543 A1* | 10/2009 | Keyser | ................. H05K 5/0069 |
| | | | 361/732 |

* cited by examiner

OVERMOLDED PRINTED CIRCUIT BOARD AND CONNECTOR WITH INTEGRATED STAND-UP MOUNTING AND GROUND CONNECTION

CROSS-REFERENCE TO RELATED APPLICATIONS

This application claims the benefit of provisional application 63/349,579, filed Jun. 6, 2022. The disclosure of the above application is incorporated herein by reference.

FIELD OF THE INVENTION

The invention relates generally to a control unit having a standup connection structure which includes a connector, vehicle mounting locations integrated into the connector, and the connector and a PCB are overmolded together, where the PCB may be populated or unpopulated, or the PCB may be part of an electronics sub-assembly which also includes other electronic components.

BACKGROUND OF THE INVENTION

Control units are commonly used for controlling various components of the drive line of a vehicle, such as the engine, transmission, or transfer case. Due to thermal management and various packaging requirements, the design and configurations of control units have become more stringent. Various existing designs of control units include pre-molded connector pins, connector pins which have a right-angle or L-shape and are longer than desired, an undesirable footprint, and require additional overmold material to cover the L-shaped connector pins. Some control units also require additional brackets for mounting to the vehicle and to achieve desired orientation of the printed circuit board.

Accordingly, there exists a need for a control unit which overcomes the aforementioned drawbacks, meets desired packaging requirements, and is of simpler construction.

SUMMARY OF THE INVENTION

In an embodiment, the present invention is a control unit which meets desired packaging requirements, eliminates the need for right-angle or L-shaped pins, and has a reduced footprint.

In an embodiment, the present invention is a control unit, which includes a connector, a circuit board connected to the connector, and an encapsulation housing. The encapsulation housing surrounds at least a portion of the circuit board and at least a portion of the connector.

In an embodiment, the connector includes a base flange, a shroud integrally formed with the base flange, a plurality of pins extending through the base flange such that a portion of each of the plurality of pins is surrounded by the shroud, and another portion of each of the plurality of pins extends into the circuit board. The connector also includes at least one grounding pin connected to the base flange. A portion of the at least one grounding pin extends through the base flange and into the circuit board.

In an embodiment, at least one mounting post is integrally formed as part of the base flange, and a least one bushing extends through the mounting post and is in contact with the grounding pin. The bushing extends through the mounting post such that the bushing is in contact with the grounding pin. In an embodiment, the grounding pin and the bushing are part of a grounding connection.

In an embodiment, the grounding pin includes a ring portion adjacent to and in contact with the mounting post, such that the ring portion is in contact with the bushing.

In an embodiment, the grounding pin includes a flange portion integrally formed with the ring portion, and the flange portion is in contact with and supported by the mounting post.

In an embodiment, the grounding pin includes a pin portion, and the pin portion extends through the base flange and into the circuit board.

In an embodiment, the grounding pin includes a body portion, at least one barb integrally formed as part of the body portion, and at least one side flange integrally formed as part of the body portion. The body portion is inserted through the base flange such that the side flange contacts the base flange, and the barb prevents the grounding pin from being disconnected from the connector.

In an embodiment, the connector includes a plurality of support ribs, and each of the support ribs contacts the circuit board and support the connector as the connector is connected to the circuit board.

In an embodiment, the connector includes a plurality of crush ribs and a plurality of support ribs. Each of the crush ribs are deformed as the connector is connected to the circuit board as the support ribs come into contact with the circuit board. The crush ribs are optionally included, such that the connector may be assembled without the use of the crush ribs.

In an embodiment, the connector includes a peripheral support wall, and at least one of the crush ribs is integrally formed as part of the peripheral support wall.

In an embodiment, the encapsulation housing is formed during an injection molding process.

In an embodiment, the circuit board is a printed circuit board, and in yet another embodiment, the circuit board is a populated printed circuit board. The circuit board may also be part of an electronics sub-assembly which also includes other electronic components.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
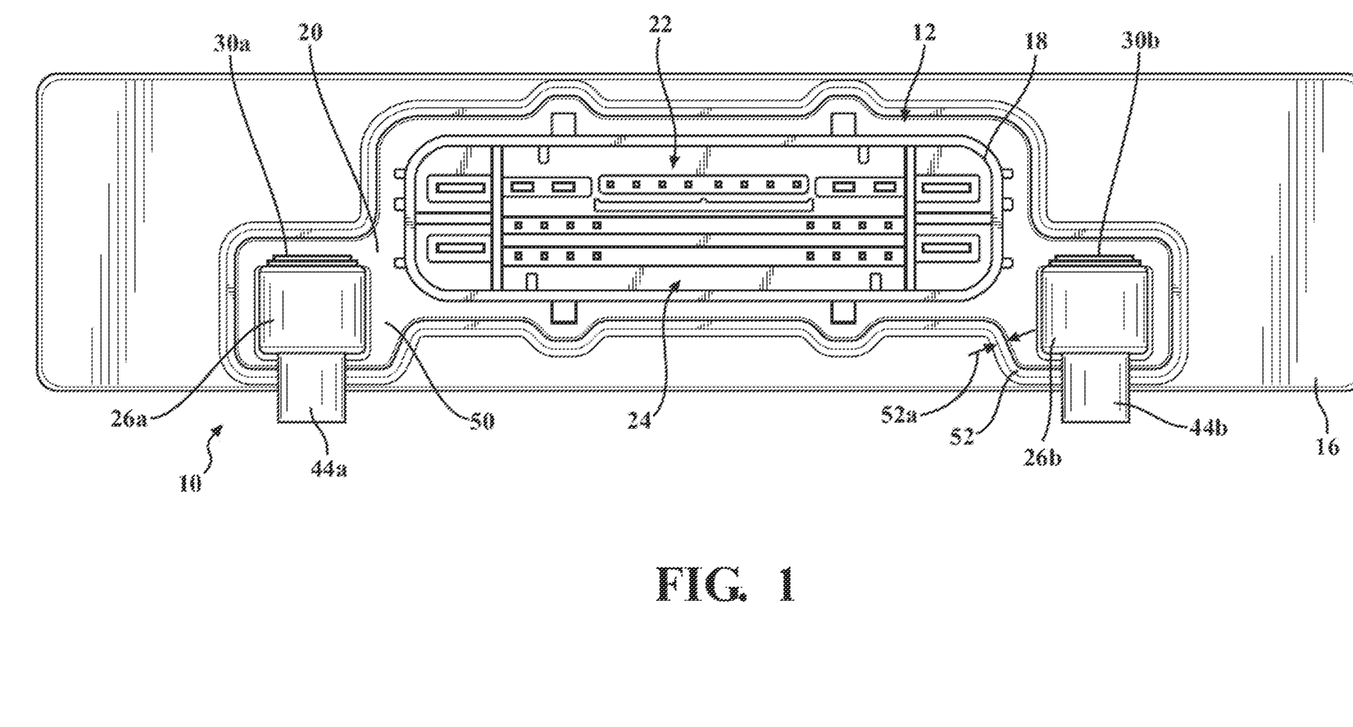
FIG. 1 is a front view of a control unit having a standup connection structure and ground connection, according to embodiments of the present invention.
Figure 2:
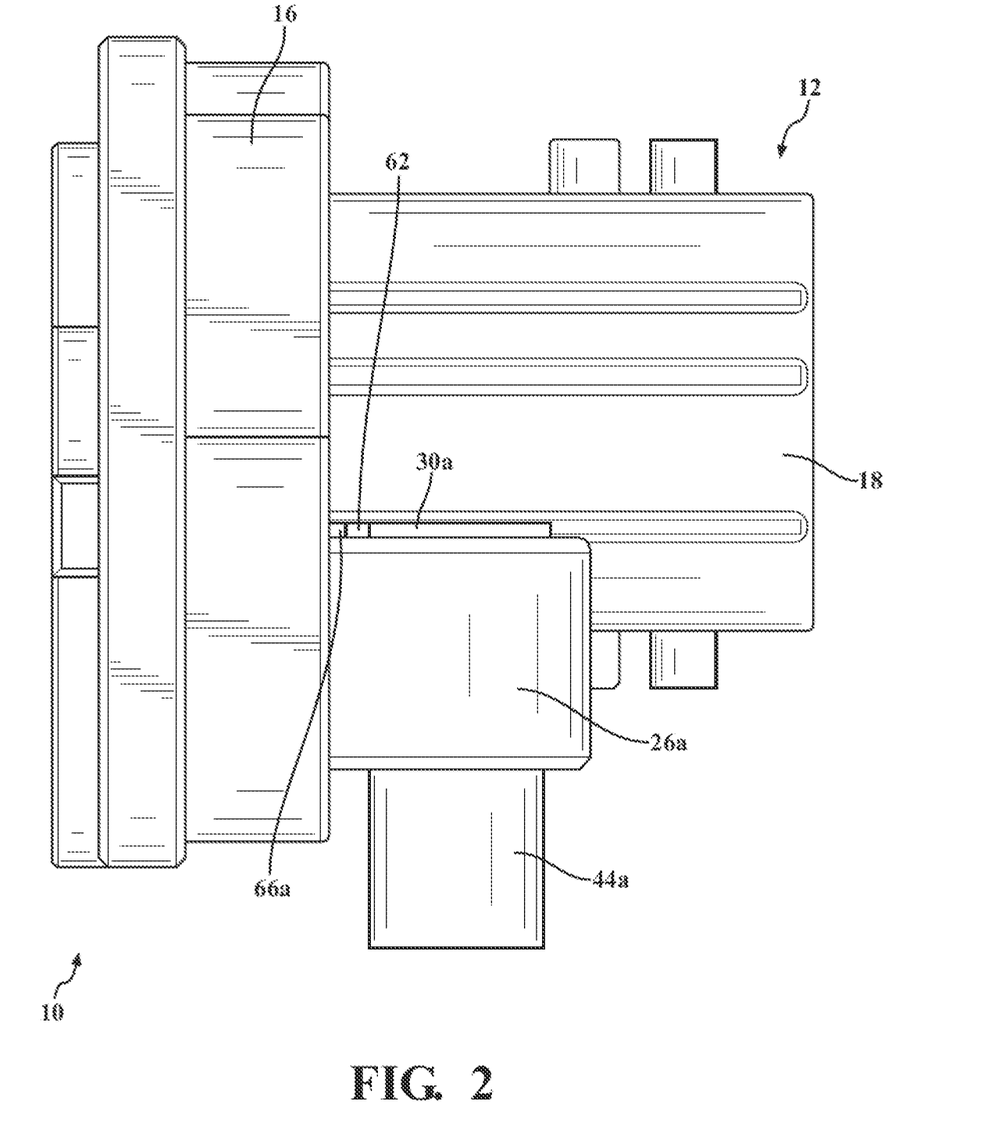
FIG. 2 is a side view of a control unit having a standup connection structure and ground connection, according to embodiments of the present invention.
Figure 3:
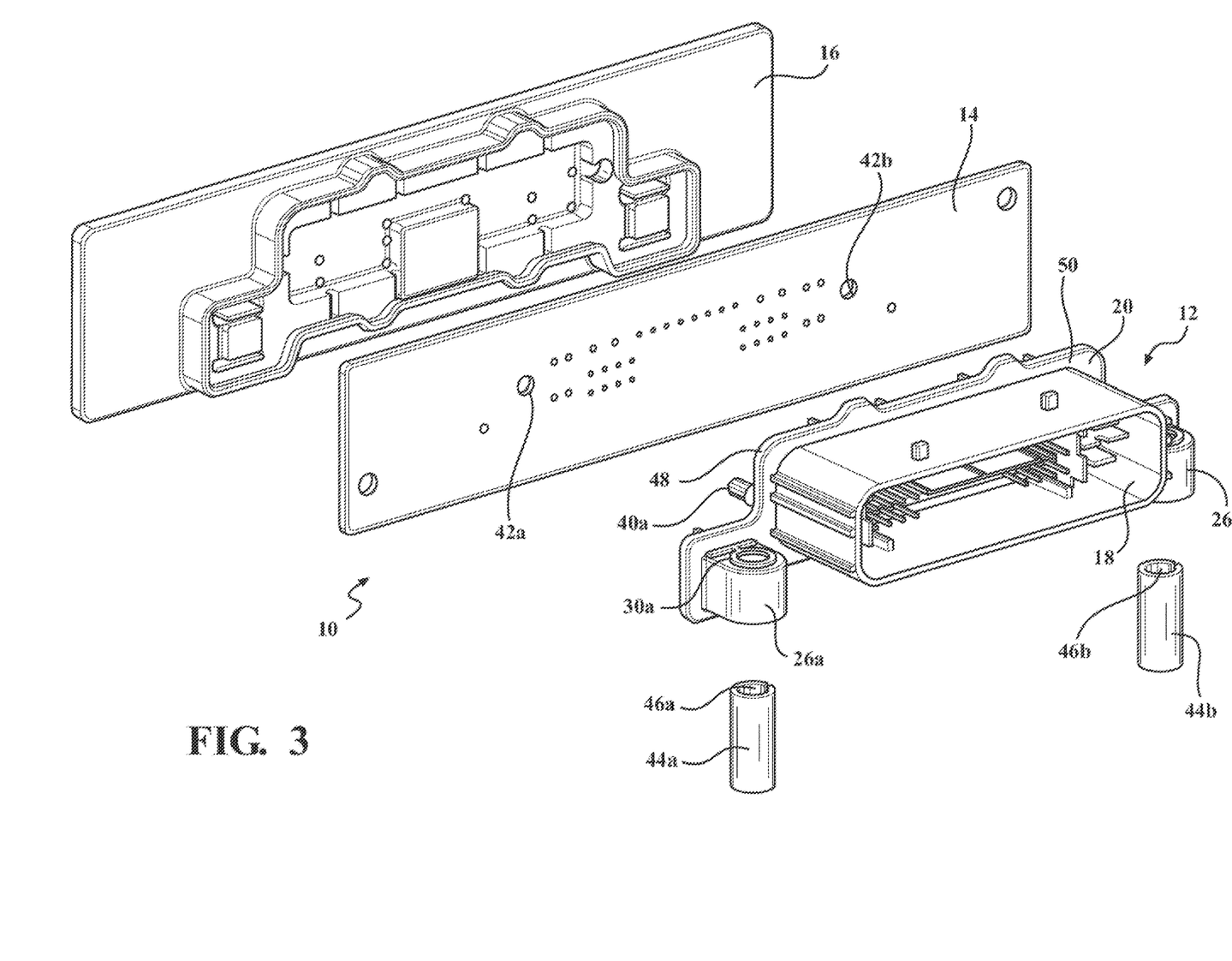
FIG. 3 is an exploded view of a control unit having a standup connection structure and ground connection, according to embodiments of the present invention.

An embodiment of a control unit having a standup connection structure and ground connection is shown in FIGS. 1-3, generally at 10. The control unit 10 includes a connector, shown generally at 12, a printed circuit board (PCB) 14, and an encapsulation housing 16.

The connector 12 includes a shroud 18 integrally formed together with a base flange 20. The connector 12 also includes a plurality of pins, shown generally at 22, each of which extend through the base flange 20 of the connector 12 such that a portion of each of the plurality of pins 22 are located in a cavity, shown generally at 24, surrounded by the shroud 18. Also integrally formed with the base flange 20 is a first mounting post 26a having a first aperture 28a, and a second mounting post 26b having a second aperture 28b. On the opposite side of the base flange 20 relative to the mounting posts 26a,26b is a first support post 64a and a second support post 64b.

Figure 4A:
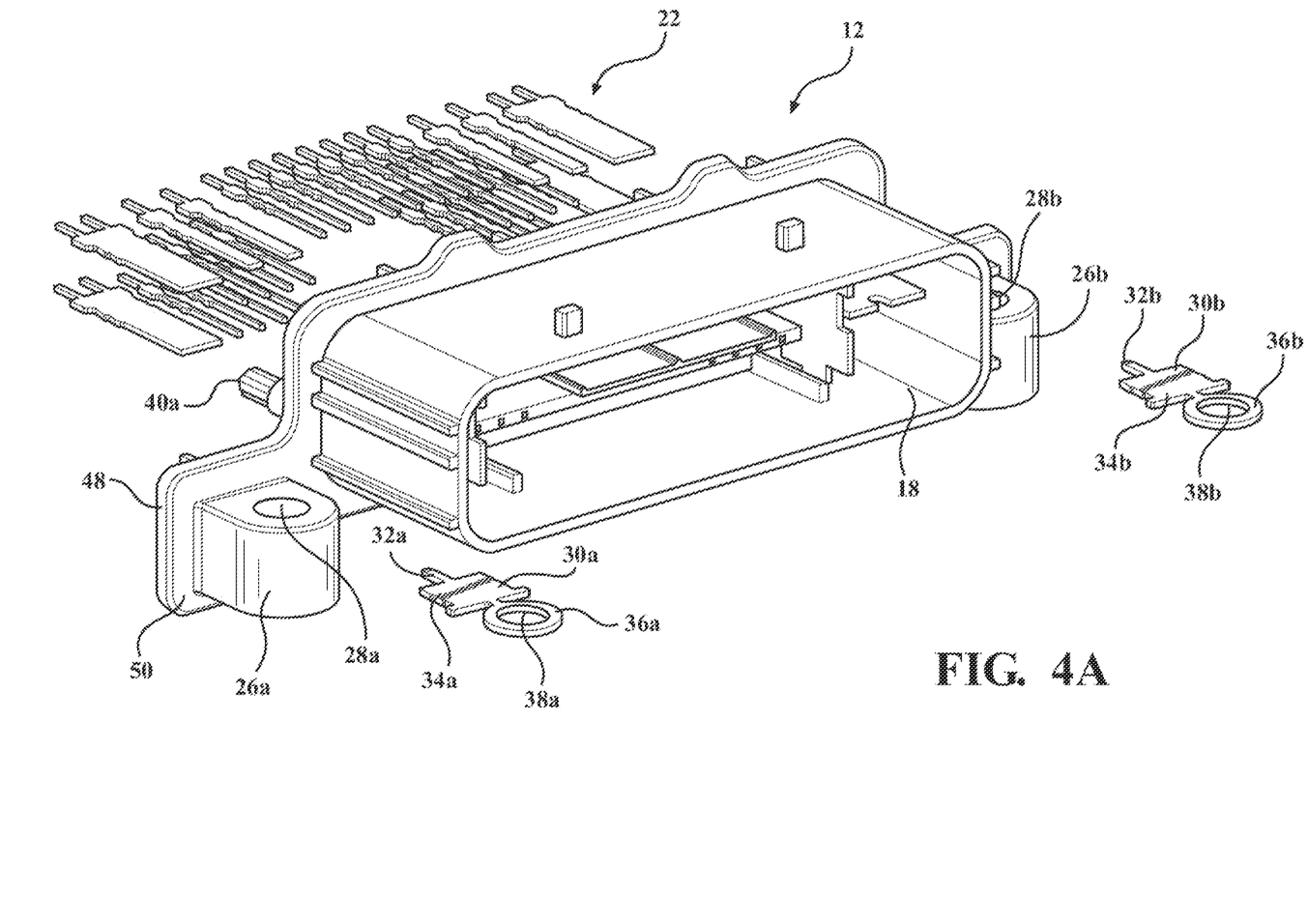
FIG. 4A is an exploded view of a connector used as part of a control unit having a standup connection structure and ground connection, according to embodiments of the present invention.
Figure 4B:
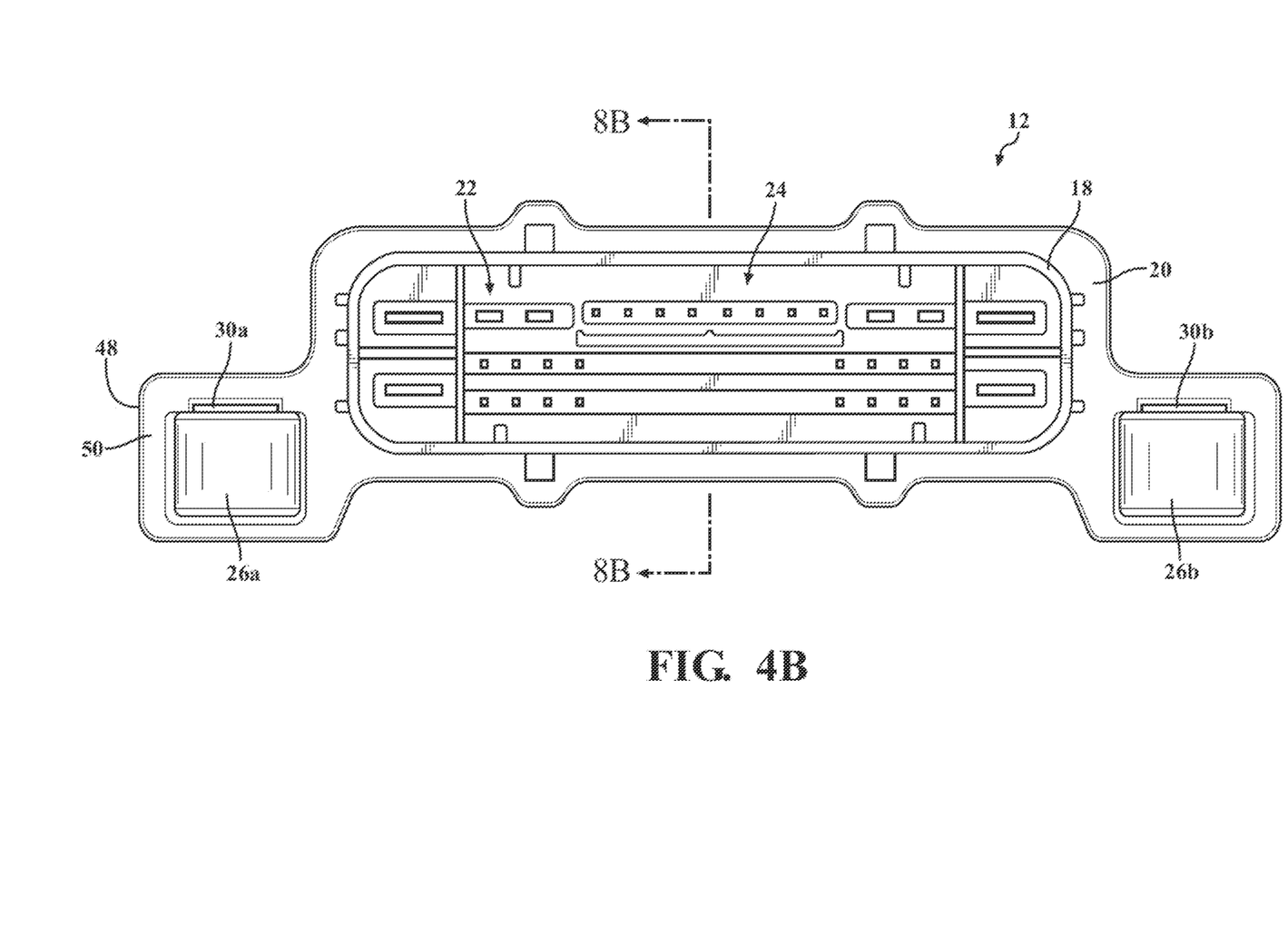
FIG. 4B is a front view of a connector used as part of a control unit having a standup connection structure and ground connection, according to embodiments of the present invention.
Figure 4C:
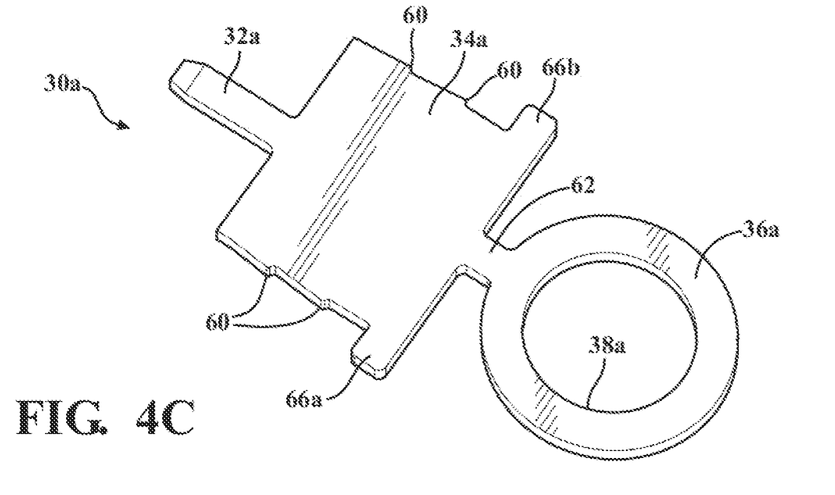
FIG. 4C is a perspective view of a grounding pin used as part of a standup connection structure and ground connection, according to embodiments of the present invention.
Figure 4D:
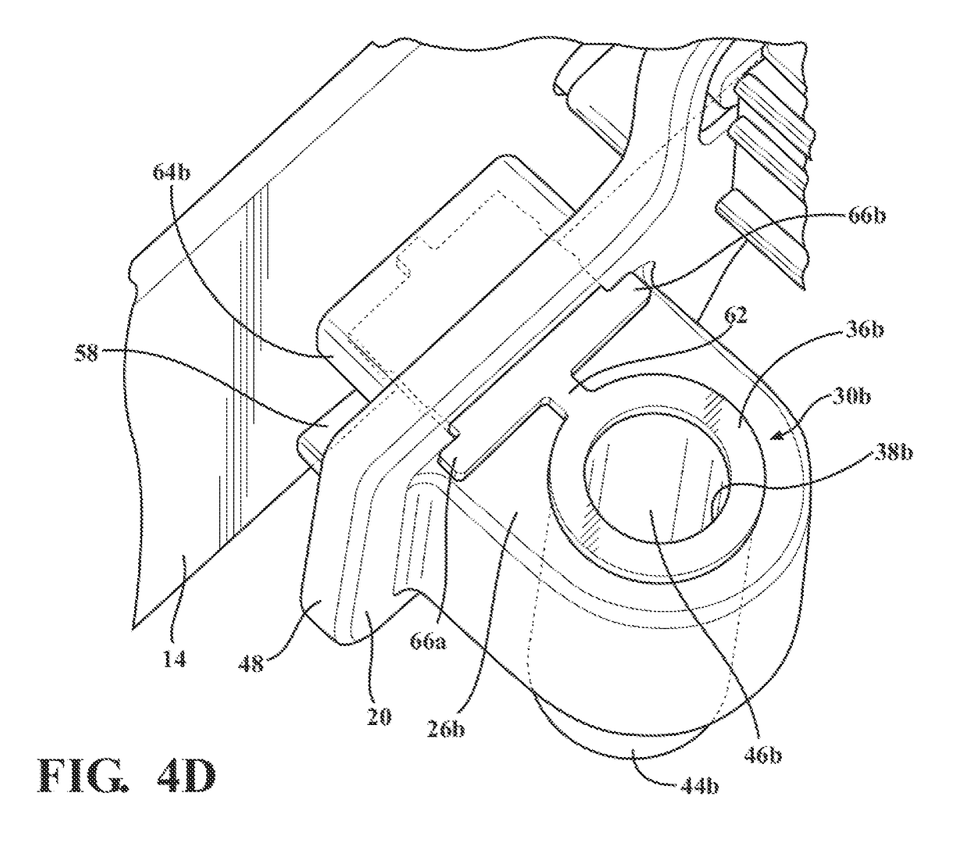
FIG. 4D is a perspective view of several components of a control unit having a standup connection structure and ground connection, according to embodiments of the present invention.
Figure 4E:
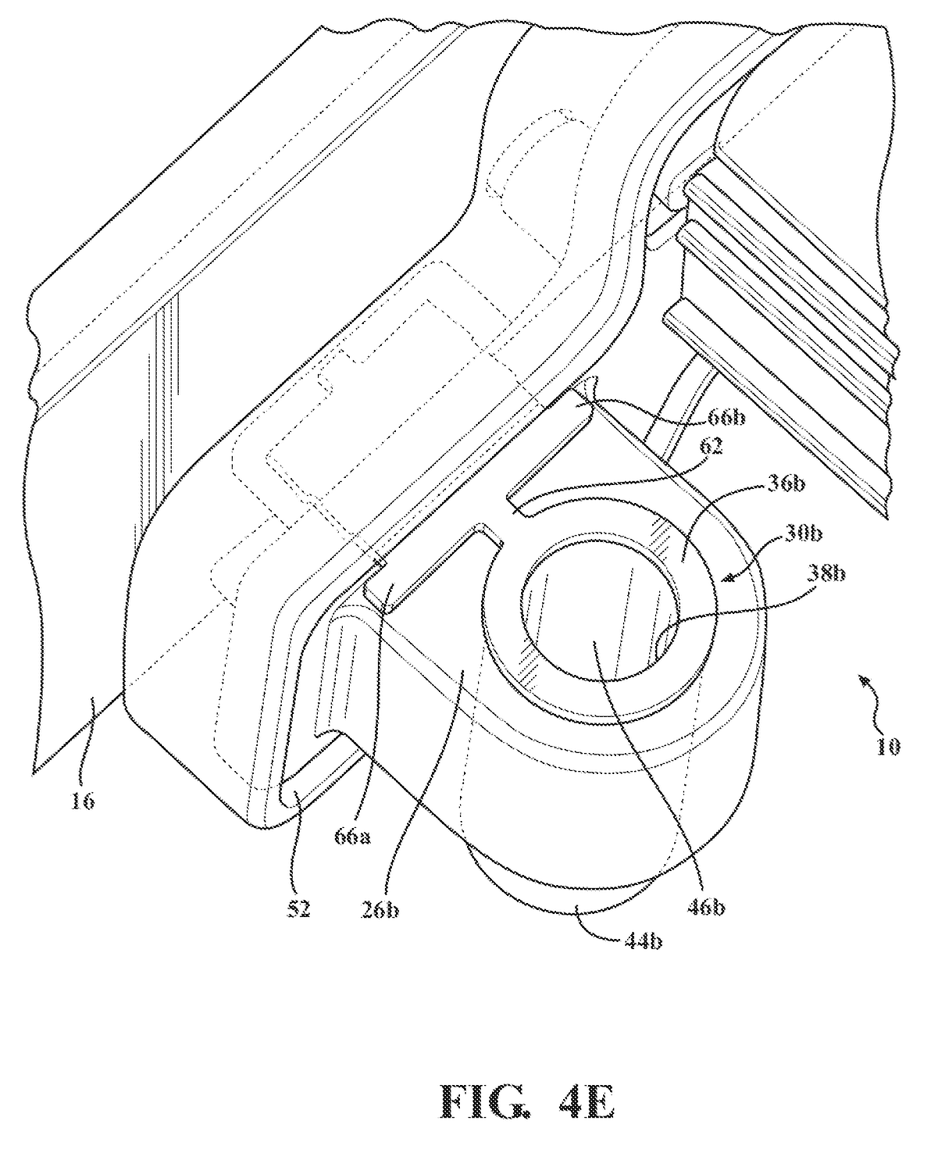
FIG. 4E is a perspective view of a control unit having a standup connection structure and ground connection, according to embodiments of the present invention.
Figure 5A:
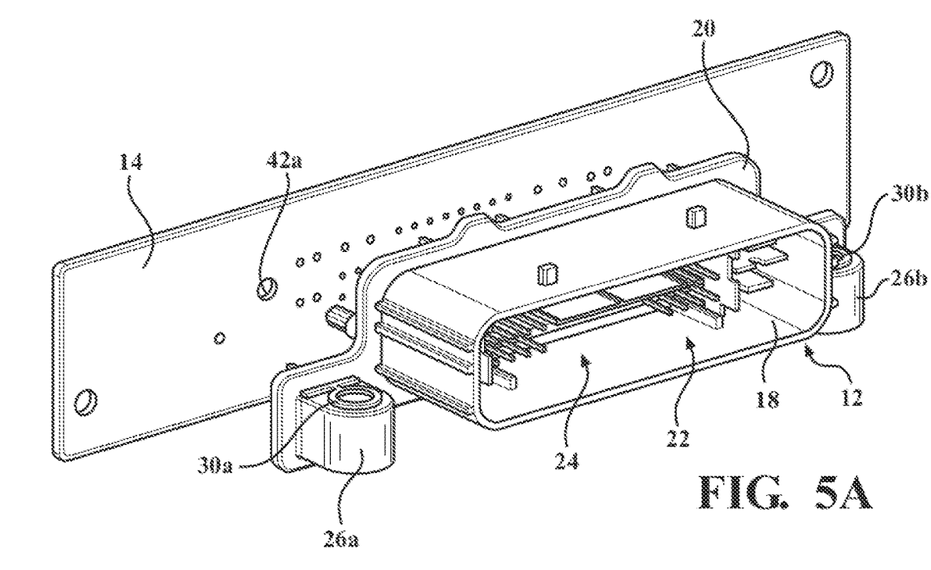
FIG. 5A is a partial exploded view of a pre-assembly, which is part of a control unit having a standup connection structure and ground connection, according to embodiments of the present invention.
Figure 5B:
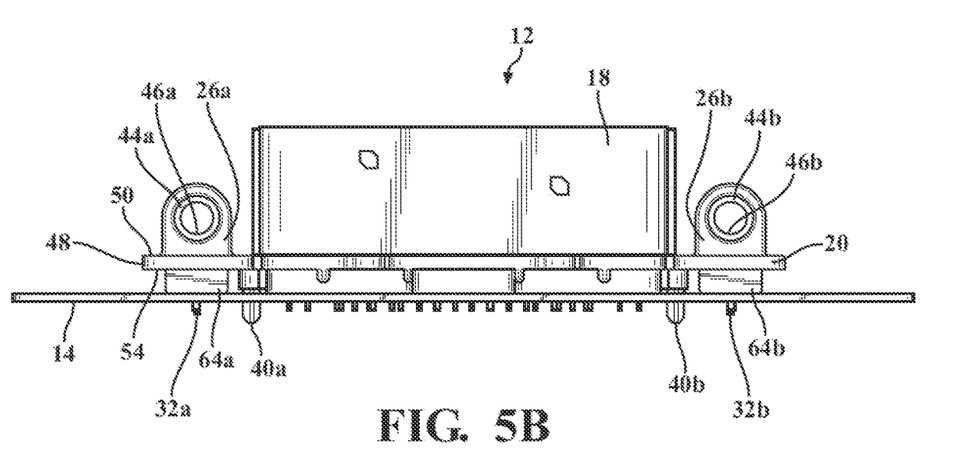
FIG. 5B is a bottom view of a pre-assembly, which is part of a control unit having a standup connection structure and ground connection, according to embodiments of the present invention.
Figure 6:
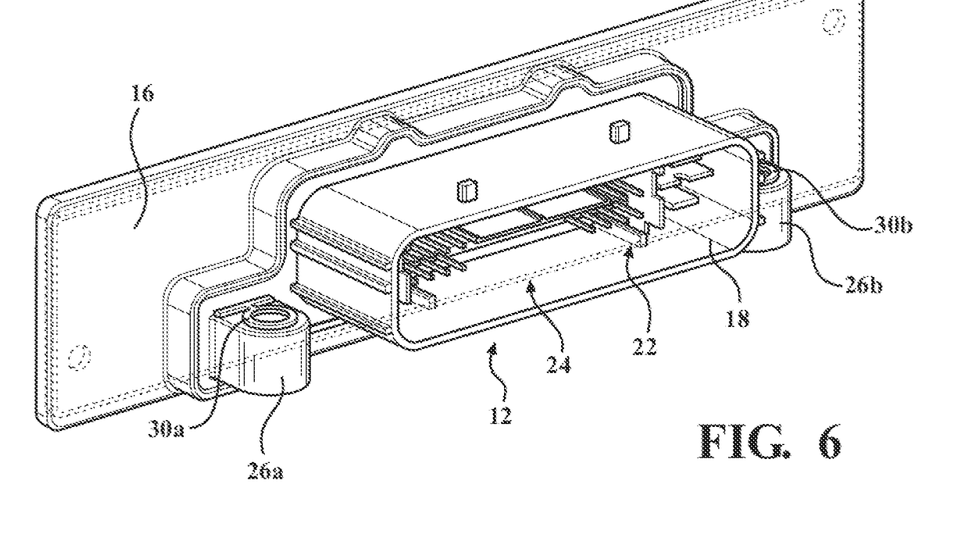
FIG. 6 is a perspective view of a control unit having a standup connection structure and ground connection, according to embodiments of the present invention.
Figure 7:
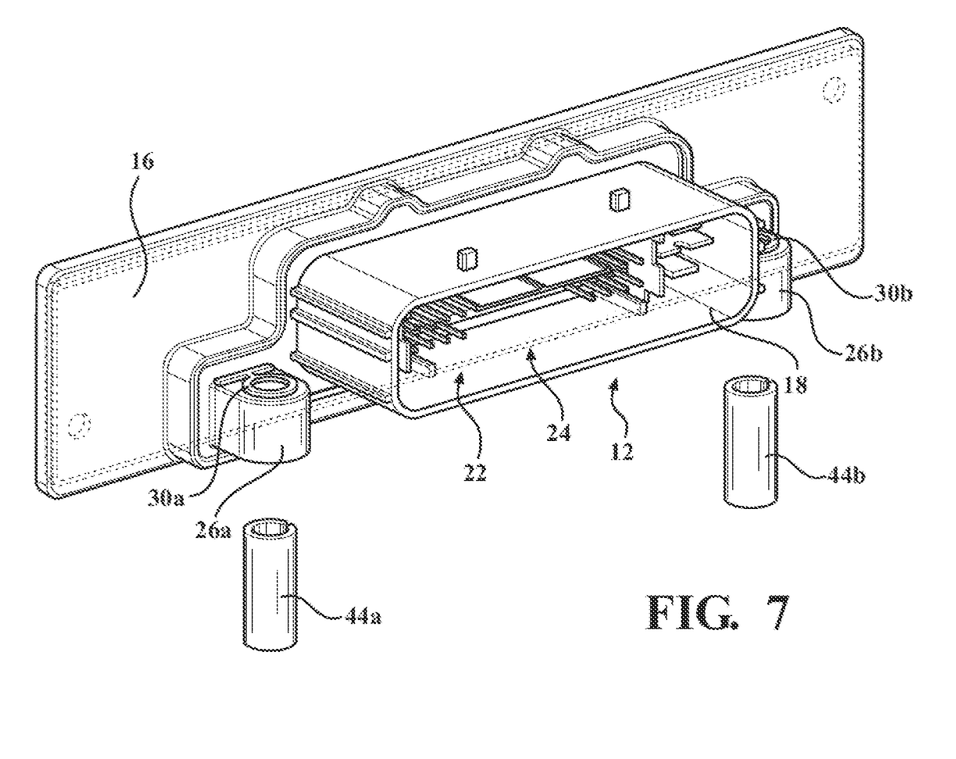
FIG. 7 is a partial exploded perspective view of a control unit having a standup connection structure and ground connection, according to embodiments of the present invention.

Referring to FIGS. 4A-4E, the connector 12 furthermore includes two grounding pins, shown generally at 30a,30b, respectively. Each grounding pin 30a,30b has a pin portion 32a,32b, a body portion 34a,34b, and a ring portion 36a,36b having a corresponding aperture 38a,38b. With specific reference to FIG. 4C where the first grounding pin 30a is shown, the body portion 34a and the ring portion 36a are connected by a flange portion 62 (the second grounding pin 30b also has a flange portion, shown but not labeled in FIG. 4A). The flange portion 62 is of a thickness such that the ring portion 36a is able to deflect relative to the body portion 34a to accommodate various tolerances during assembly. Integrally formed with the body portion 34a is a plurality of barbs 60 and two side flanges 66a,66b (the body portion 34b of the second grounding pin 30b also includes barbs and side flanges, which are shown in FIGS. 4A and 4D-4E).

When assembled, the pin portion 32a and the body portion 34a of the first grounding pin 30a extend through the base flange 20 and into the first support post 64a such that the side flanges 66a,66b are in contact with the base flange 20, the flange portion 62 and the side flanges 66a,66b of the first grounding pin 30a are in contact with and supported by the first mounting post 26a, and the aperture 38a of the first grounding pin 30a is aligned with the aperture 28a of the first mounting post 26a. Also, when assembled, the pin portion 32b and the body portion 34b of the second grounding pin 30b extend through the base flange 20 and into the second support post 64b such that the side flanges are in contact with the base flange 20, the flange portion and the side flanges of the second grounding pin 30b are in contact with and supported by the second mounting post 26b, and the aperture 38b of the second grounding pin 30b is aligned with the aperture 28b of the second mounting post 26b. The grounding pins 30a,30b are intended to be permanently connected to the base flange 20 and the corresponding support posts 64a,64b, such that the barbs 60 prevent the grounding pins 30a,30b from being removed without causing catastrophic failure of the connector 12. The side flanges 66a,66b limit how far the grounding pins 30a,30b may be inserted through the base flange 20 and the support posts 64a,64b. The barbs 60 and side flanges 66a,66b provide the correct positioning of the grounding pins 30a,30b to ensure that when assembled, the aperture 38a of the first grounding pin 30a is aligned with the first aperture 28a of the first mounting post 26a and the aperture 38b of the second grounding pin 30b is aligned with the aperture 28b of the second mounting post 26b.

The support posts 64a,64b have openings through which the pin portions 32a,32b extend, such that at least part of each of the pin portions 32a,32b protrudes out of the support posts 64a,64b. The part of each of the pin portions 32a,32b which protrudes out of the support posts 64a,64b extends through the PCB 14.

Referring to FIGS. 4A-5B, a portion of each of the plurality of pins 22 extends through the PCB 14, and a portion of each of the pin portions 32a,32b also extends through the PCB 14 when the connector 12 is connected to the PCB 14. The pins 22 and the grounding pins 30a,30b are straight, and do not have a bend. The pins 22 and grounding pins 30a,30b may be assembled to the connector 12 by insertion into the connector 12, or the connector 12 may molded around portions of the pins 22 and the grounding pins 30a,30b by an injection molding process. It is also within the scope of the invention that pins 22 and the grounding pins 30a,30b may be assembled to the connector 12 using a stitch pin process, an overmold process, a combination pre-mold and overmold process, or the like.

Integrally formed with the base flange 20 is a first alignment post 40a and a second alignment post 40b. The first alignment post 40a extends through a first alignment aperture 42a integrally formed as part of the PCB 14, and the second alignment post 40b extends through a second alignment aperture 42b integrally formed as part of the PCB 14.

The control unit 10 also includes two bushings 44a,44b, where the bushings 44a,44b and the grounding pins 30a,30b provide grounding connections for the PCB 14. The first bushing 44a is partially disposed in the first aperture 28a and is in contact with the ring portion 36a of the first grounding pin such that an aperture 46a of the first bushing 44a is aligned with the aperture 38a of the first grounding pin 30a. The second bushing 44b is partially disposed in the second aperture 28b and is in contact with the ring portion 36b of the second grounding pin 30b such that an aperture 46b of the second bushing 44b is aligned with the aperture 38b of the second grounding pin 30b. The apertures 46a,46b of the bushings 44a,44b are approximately the same diameter as the apertures 38a,38b of the grounding pins 30a,30b.

The encapsulation housing 16 substantially surrounds almost all of the PCB 14, with the exception of the area of the PCB 14 in contact with portions of the connector 12. The encapsulation housing 16 also surrounds a portion of the base flange 20, shown in FIG. 1. More specifically, referring to FIGS. 1 and 5A-7, the encapsulation housing 16 surrounds a perimeter sidewall 48 of the base flange 20, and also surrounds a portion of an exterior surface 50 of the base flange 20. The encapsulation housing 16 includes a lip portion 52, and the lip portion 52 is the part of the encapsulation housing 16 which covers part of the exterior surface 50 of the base flange 20. The lip portion 52 has a width 52a, shown in FIG. 1, which is constant throughout the entire length of the lip portion 52.

Figure 8A:
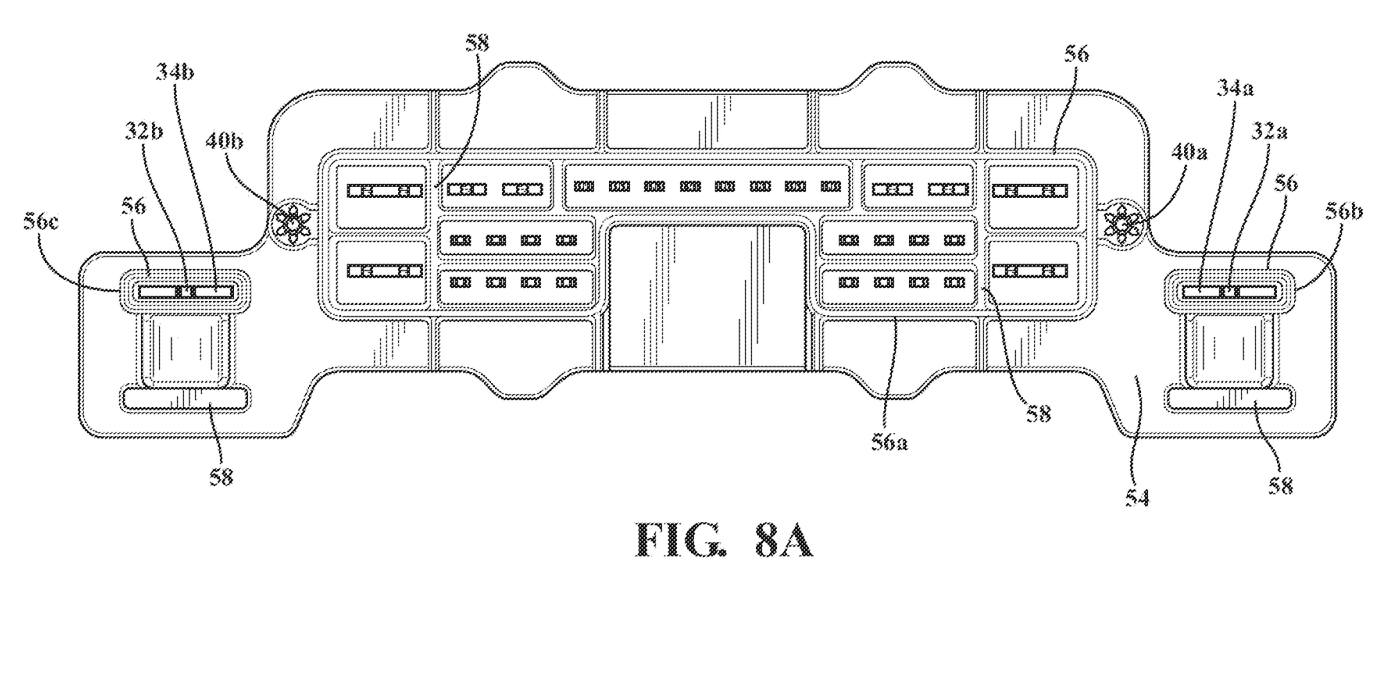
FIG. 8A is a rear view of a connector used as part of a control unit having a standup connection structure and ground connection, according to embodiments of the present invention.
Figure 8B:
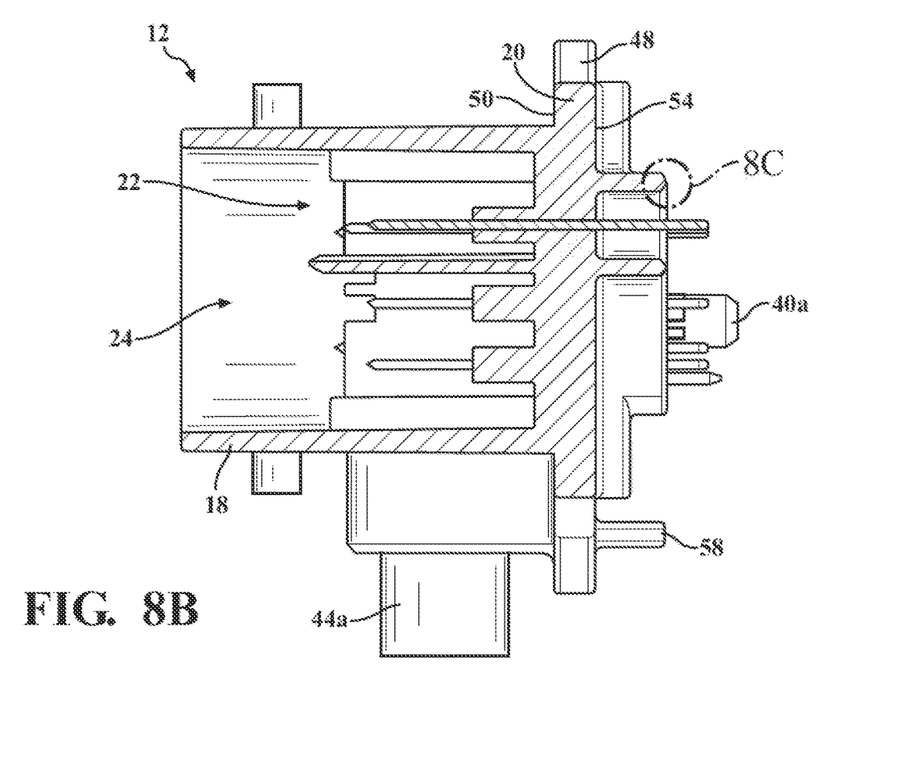
FIG. 8B is a sectional view taken along lines 8B-8B of FIG. 4B.
Figure 8C:
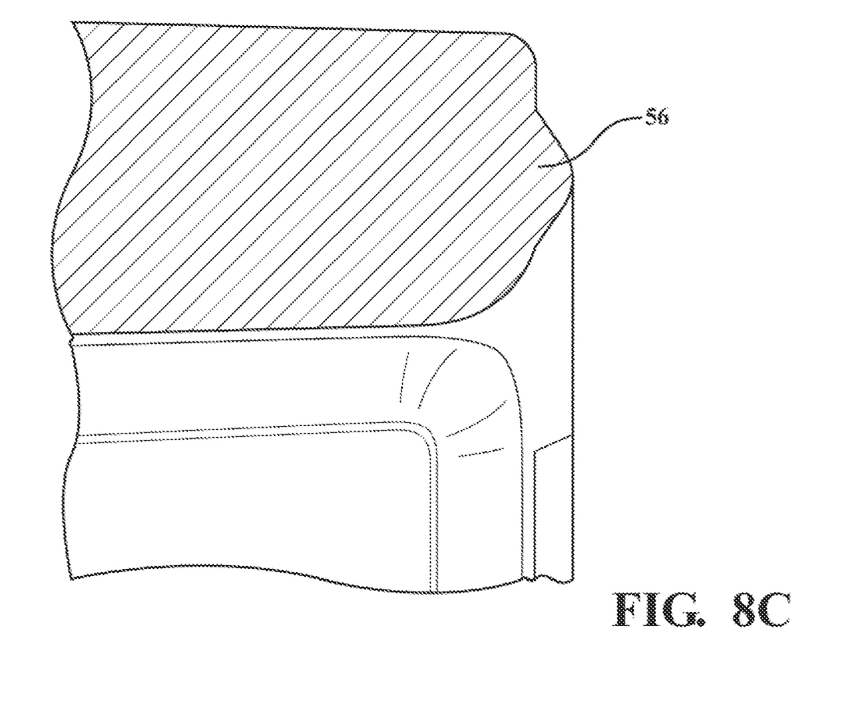
FIG. 8C in an enlarged view of the portion marked 8C in FIG. 8B.
Figure 8D:
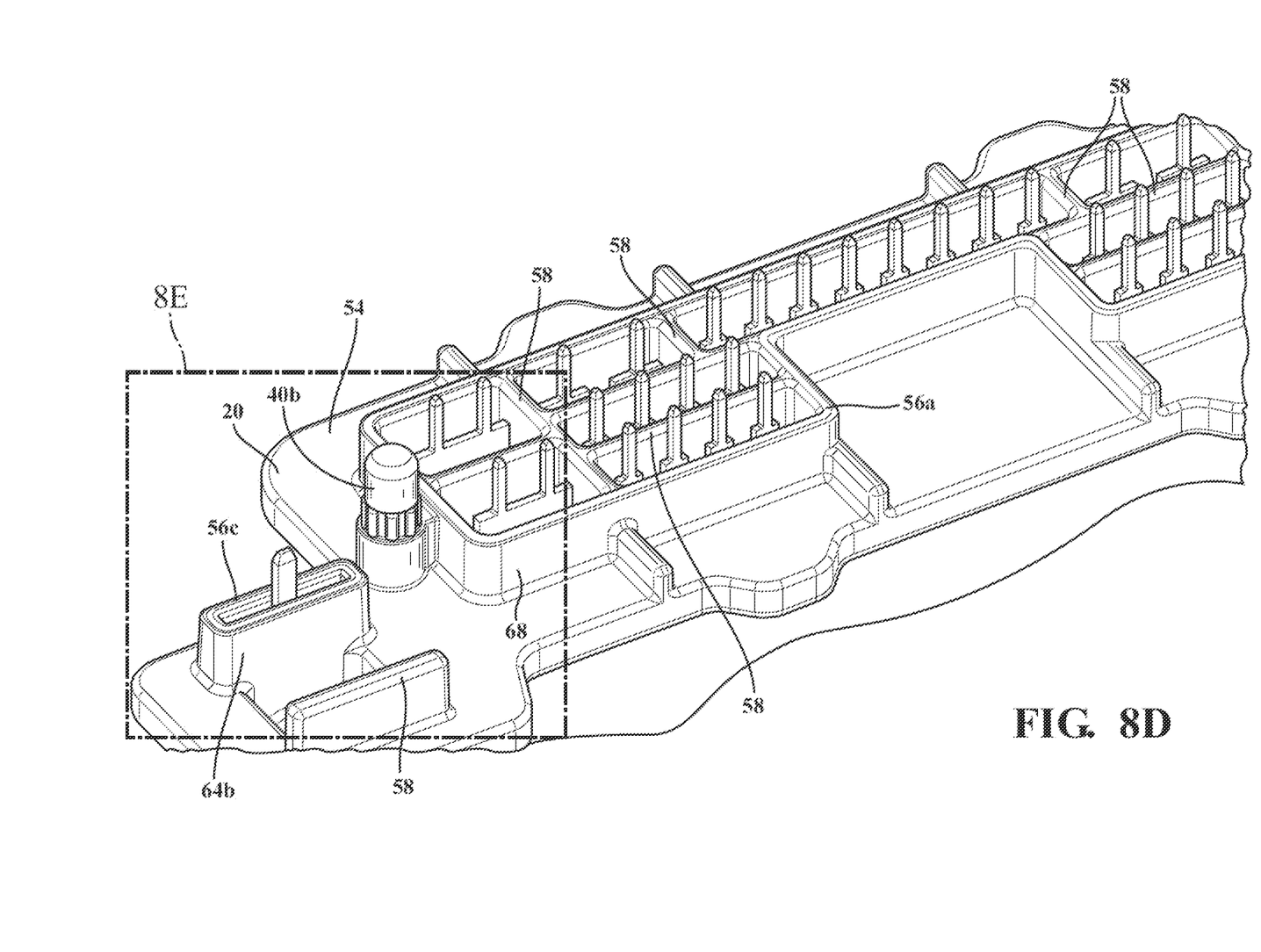
FIG. 8D is a perspective view of a portion of a connector, which is part of a control unit having a standup connection structure and ground connection, according to embodiments of the present invention.
Figure 8E:
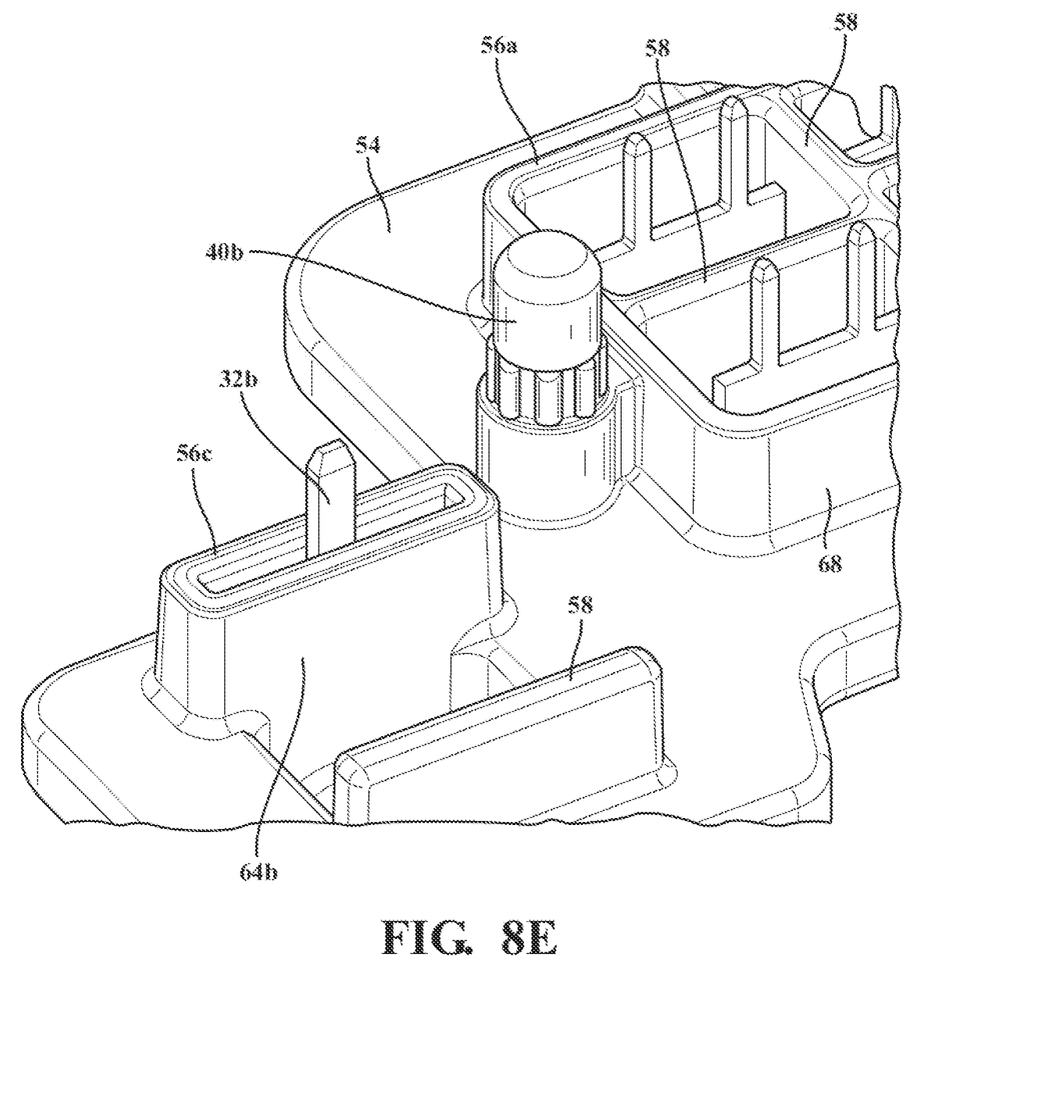
FIG. 8E is an enlarged view of the portion marked 8E in FIG. 8D.

Referring to FIGS. 5B and 8A-8E, the base flange 20 also includes a rear surface 54, and the support posts 64a,64b are integrally formed with the base flange 20 such that the support posts 64a,64b extend away from the rear surface 54. The connector 12 also includes a plurality of crush ribs 56 and a plurality of support ribs 58. Also integrally formed with and extending away from the rear surface 54 is a peripheral support wall 68, and integrally formed with the peripheral support wall 68 is one of the crush ribs 56. More specifically, as shown in FIGS. 8A and 8D-8E, a crush rib 56a is integrally formed as part of the peripheral support wall 68, where the peripheral support wall 68 circumscribes the plurality of pins 22 protruding through the base flange 20. Some of the support ribs 58 are integrally formed with the peripheral support wall 68 and extend away from the rear surface 54, as shown in FIGS. 8A and 8D-8E. Another crush rib 56b is integrally formed as part of the first support post 64a and yet another crush rib 56c is integrally formed as part of the second support post 64b. The second crush rub 56b circumscribes the pin portion 32a of the first grounding pin 30a, and the third crush rib 56c circumscribes the pin portion 32b of the second grounding pin 30b.

It should be noted that in alternate embodiment, it is within the scope of the invention that a back potted connector may be used instead of the connector 12 shown.

Referring to the Figures generally, during assembly, the pins 22 and the grounding pins 30a,30b are assembled to the base flange 20 as previously described. The connector 12 is then positioned to be assembled to the PCB 14. To assemble the connector 12 to the PCB 14, the first alignment post 40a is aligned with the first alignment aperture 42a, and the second alignment post 40b is aligned with the second alignment aperture 42b. During assembly, the exterior surface 50 of the base flange 20 functions as a tool press area, where force is applied to the exterior surface 50 of the base flange 20 in an area of the base flange 20 which is unoccupied by the shroud 18 or the mounting posts 26a,26b. In an alternate embodiment, force may be applied to both the base flange 20 and the shroud 18. The crush ribs 56 protrude outwardly further compared to the support ribs 58, and the force is applied to the base flange 20 and/or the shroud 18 such that the crush ribs 56 are deformed, and the support ribs 58 then contact the PCB 14 under a predetermined force load, and additionally, the first alignment post 40a extends into the first alignment aperture 42a, and the second alignment post 40b extends into the second alignment aperture 42b. Once the connector 12 is in the desired position relative to the PCB 14, the force applied to the base flange 20 and/or the shroud 18 is distributed between the support ribs 58, support posts 64a,64b, and peripheral support wall 68. The force applied to the base flange 20 is maintained as one or more of the pins 22 are connected to the PCB 14 using a solder or other type of connection.

In an alternate embodiment, the crush ribs 56 are not used, and instead the support ribs 58, support posts 64a,64b, and peripheral support wall 68, are used to support the connector 12 as force is applied to the base flange 20 during this step of the assembly process.

The connection of the connector 12 and PCB 14 forms a "pre-assembly," and once the solder process is complete, the pre-assembly is placed into a tooling device, or a molding device, where several holding devices, such as clamps or the like, hold the pre-assembly in place while a resin or type of plastic material is injected into the tooling device during an overmolding process. The resin/plastic material is injected into the tooling device to form the encapsulation housing 16, which surrounds various parts of the PCB 14 and the base flange 20 of the connector 12 as previously described. The overmolding process also results in a portion of the encapsulation housing 16 being disposed between the PCB 14 and the base flange 20. There are portions of the encapsulation housing 16 which surround the support posts 64a,64b, the peripheral support wall 68, and the support ribs 58 which are not surrounded by the peripheral support wall 68. Referring to FIG. 3, there is an exploded view of the control unit 10 which depicts the connector 12, the PCB 14, and the encapsulation housing 16 separately, however, the connector 12, the PCB 14, and the encapsulation housing 16 are connected together during an overmolding process and cannot be separated without catastrophically damaging the control unit 10.

After the overmolding process is complete, the bushings 44a,44b are inserted into the apertures 28a,28b such that the bushings 44a,44b are positioned in the apertures 28a,28b as described above. As the bushings 44a,44b are inserted into the apertures 28a,28b, the ring portion 36a,36b of each grounding pin 30a,30b is supported to prevent any part of the grounding pins 30a,30b from deflecting during this step of the assembly process.

Once the bushings 44a,44b are assembled to the mounting posts 26a,26b, fasteners may be inserted through the apertures 38a,38b, respectively, of the grounding pins 30a,30b and through apertures 46a,46b of the bushings 44a,44b to mount the control unit 10 in the desired manner. The combination of the grounding pins 30a,30b, the bushings 44a,44b, and the fasteners provides two ground connections. The fasteners pass through the bushings 44a,44b and may achieve the desired ground connection by the fasteners placing the bushings 44a,44b in physical contact with the chassis of the vehicle, or the fasteners may be in contact with the respective grounding pin 30a,30b and the metal component the fasteners are connected to. As mentioned above, the flange portion 62 of the first grounding pin 30a is able to flex and deflect, such that when one of the fasteners is inserted through the aperture 38a of the ring portion 36a and the bushing 44a, if the ring portion 36a is not already in contact with the bushing 44a, the ring portion 36a is placed in contact with bushing 44a as the fastener is tightened (the flange portion of the second grounding pin 30b functions in a similar manner).

Additionally, the orientation of the PCB 14 relative to the connector 12 and being held together by the encapsulation housing 16 provides a stand-up connection structure, eliminating the need for the pins 22 or the grounding pins 30a,30b to be L-shaped. The fasteners provide the function of attaching the control unit 10 to a vehicle in the desired manner, and are also part of the desired ground connections. The orientation of the connector 12, the PCB 14, and the encapsulation housing 16 also provide for the control unit 10 to be orientated to meet desired packing requirements.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a control unit, including:
      a connector further comprising:
         a plurality of crush ribs;
         a plurality of support ribs (58);
         a peripheral support wall), at least one of the plurality of crush ribs is integrally formed as part of the peripheral support wall;
      a circuit board connected to the connector such that each of the plurality of crush ribs is deformed as the connector is connected to the circuit board and the support ribs come into contact with the circuit board; and
      an encapsulation housing;
   wherein the encapsulation housing surrounds at least a portion of the circuit board and at least a portion of the connector.

2. The apparatus of claim 1, the connector further comprising:
   a base flange;
   a shroud integrally formed with the base flange;
   a plurality of pins extending through the base flange such that a portion of each of the plurality of pins is surrounded by the shroud, and another portion of each of the plurality of pins extends into the circuit board; and
   at least one grounding pin connected to the base flange;
   wherein a portion of the at least one grounding pin extends through the base flange and into the circuit board.

3. The apparatus of claim 2, further comprising:
   at least one mounting post integrally formed as part of the base flange; and
   at least one bushing extending through the at least one mounting post such that the at least one bushing is in contact with the at least one grounding pin, the at least one grounding pin and the at least one bushing being part of a grounding connection.

4. The apparatus of claim 3, the at least one grounding pin further comprising:
   a ring portion adjacent to and in contact with the at least one mounting post;
   wherein the ring portion is in contact with the at least one bushing.

5. The apparatus of claim 4, the at least one grounding pin further comprising:
   a flange portion integrally formed with the ring portion;
   wherein the flange portion in contact with and supported by the at least one mounting post.

6. The apparatus of claim 2, the at least one grounding pin further comprising a pin portion, wherein the pin portion extends through the base flange and into the circuit board.

7. The apparatus of claim 2, the at least one grounding pin further comprising:
   a body portion;
   at least one barb integrally formed as part of the body portion; and
   at least one side flange integrally formed as part of the body portion;
   wherein the body portion is inserted through the base flange such that the at least one side flange contacts the base flange, and the at least one barb prevents the at least one grounding pin from being disconnected from the connector.

8. The apparatus of claim 1, the connector further comprising:
   a plurality of support ribs;
   wherein each of the plurality of support ribs contacts the circuit board and support the connector as the connector is connected to the circuit board.

9. The apparatus of claim 1, wherein the encapsulation housing is formed during an injection molding process.

10. The apparatus of claim 1, the circuit board further comprising a printed circuit board.

11. The apparatus of claim 1, the circuit board further comprising a populated printed circuit board.

12. A control unit, comprising:
   a connector the connector further comprising:
      a base flange;
      a shroud integrally formed with the base flange;
      a plurality of pins;
      at least one mounting post integrally formed as part of the base flange;
   a circuit board connected to the connector, each of the plurality of pins extending through the base flange such that a portion of each of the plurality of pins is surrounded by the shroud, and another portion of each of the plurality of pins extends through the circuit board;
   at least one grounding pin connected to the base flange such that a portion of the at least one grounding pin extends through the base flange and into the circuit board, such that the at least one grounding pin is connected to the circuit board and in contact with the at least one mounting post; and
   an encapsulation housing which surrounds at least a portion of the circuit board and at least a portion of the connector;
   wherein a fastener is inserted through the at least one grounding pin and the at least one mounting post to provide a ground connection and connect the control unit with a vehicle.

13. The control unit of claim 12, the connector further comprising:
   at least one bushing extending through the at least one mounting post such that the at least one bushing is in contact with the at least one grounding pin;

wherein the fastener is inserted through the at least one bushing and the at least one grounding pin.

14. The control unit of claim 13, the at least one grounding pin further comprising:
   a body portion;
   a flange portion integrally formed with the body portion;
   a ring portion integrally formed with the flange portion; and
   a pin portion integrally formed with the body portion, the pin portion extends through the base flange and into the circuit board;
   wherein the body portion is inserted through the base flange such that the flange portion and the ring portion in contact with and supported by the at least one mounting post, and the ring portion is in contact with the at least one bushing, such that the fastener is inserted through the at least one bushing and the ring portion.

15. The control unit of claim 14, the at least one grounding pin further comprising:
   at least one barb integrally formed as part of the body portion; and
   at least one side flange integrally formed as part of the body portion;
   wherein the body portion is inserted through the base flange such that the at least one side flange contacts the base flange, and the at least one barb prevents the at least one grounding pin from being disconnected from the connector.

16. The control unit of claim 12, the connector further comprising:
   a plurality of crush ribs;
   a peripheral support wall, at least one of the plurality of crush ribs integrally formed as part of the peripheral support wall; and
   a plurality of support ribs;
   wherein each of the plurality of crush ribs are deformed as the connector is connected to the circuit board such that the support ribs come into contact with the circuit board, the plurality of support ribs contacts the circuit board, and the plurality of support ribs and the peripheral side support wall support the connector as the connector is connected to the circuit board.

17. The control unit of claim 12, wherein the encapsulation housing is formed during an injection molding process.

18. The control unit of claim 12, the circuit board further comprising a populated printed circuit board.

* * * * *